United States Patent [19]
Jones et al.

[11] 4,442,519
[45] Apr. 10, 1984

[54] MEMORY ADDRESS SEQUENCE GENERATOR

[75] Inventors: Robert E. Jones, Fishkill; Donald H. Wood, Hopewell Junction, both of N.Y.

[73] Assignee: International Business Machines Corporation, Armonk, N.Y.

[21] Appl. No.: 354,971

[22] Filed: Mar. 5, 1982

[51] Int. Cl.³ .................. G11C 29/00; G01R 31/28
[52] U.S. Cl. .................................... 371/27; 371/21; 324/73 R
[58] Field of Search ............................ 371/21, 27, 30; 364/200, 900; 324/73 R, 73 AT

[56] References Cited

U.S. PATENT DOCUMENTS 4,263,669 4/1981 Staiger ................................. 371/27
4,300,234 11/1981 Maruyama ........................... 371/27
4,370,746 1/1983 Jones .................................... 371/27
4,389,723 6/1983 Nigorikawa ........................ 371/27

Primary Examiner—Charles E. Atkinson
Assistant Examiner—M. Ungerman
Attorney, Agent, or Firm—Robert E. Sandt

[57] ABSTRACT

Apparatus consisting of combinations of interconnected logic elements for generating preselected sequences of addresses for the listing of a matrix memory as a function of preset constants and variable timing impulses, wherein there are first and second X and Y address generators with controlled selection means for selecting the first or the second of the X and Y address pairs, each of the address generators being settably controllable to generate a preselected sequence of addresses in ascending or descending order, with settable increments within the sequence, settable masking, and settable displacements from a fixed reference origin.

7 Claims, 2 Drawing Figures

MEMORY ADDRESS SEQUENCE GENERATOR

DESCRIPTION

1. Technical Field

This invention relates in general to logic circuits and more specifically to logic circuits for producing any one of a plurality of sequences of addresses for use with an apparatus for testing the operation of a memory.

2. Background Art

It has been found that intermittent malfunctions of very large scale integrated circuit memories occur when the memories are installed in data processing equipment and subjected to certain sequences of memory operations. Since these malfunctions are application sensitive, studies have been made of typical memory failure modes leading to the design of test protocols that can be economically employed on the production line.

One such study is reported in an article entitled "Selecting Test Patterns for 4K Rams" by Wayne E. Sohl, which was published in the *IEEE Transactions on Manufacturing Technology*, Vol MFT-6, No. 3, September 1977, beginning on page 51.

As discussed in that article, very large scale integrated (VLSI) circuit memories are subject to various failure modes which are set forth in tabular form and correlated with the various test protocols designed to test for the faults, some of which protocols will detect more than one fault. The relativity of the test times of each of the test protocols is set forth as a ratio compared with the longest test, wherein the test time factor is $2(2N^2+N)$, where N is the number of test cells. For a 4K memory the article computes the number of test iterations as 67,117,056 cycle points.

It will readily be appreciated that the number of cycle points required to test a larger memory, i.e. 16K, becomes extremely large ($1.17 \times 10^9$). If the testing frequency is too slow, the test time becomes prohibitively long to be used for one hundred percent production testing. Therefore, the test protocols must be chosen to utilize the minimum number of cycle points to detect the potential faults and the frequency of the test equipment must be as high as possible.

An apparatus for testing memories according to the protocols discussed in the above-identified publication is described in U.S. Pat. No. 3,751,649 issued Aug. 7, 1973 to Thomas William Hart. That apparatus is primarily controlled by a stored program which gives it great flexibility to adopt to a variety of memory configurations and test protocols.

However, as memories become larger the requirements for storage capacity in memory become prohibitively large so as to preclude the use of small computers and microprocessors. Also, the use of memory to store instructions that require frequent repetitive access slows the effective frequency of the apparatus and so prolongs the test time as to be unacceptable for production purposes.

The generation of address sequences is one the principal areas that have heretofore required frequent repetitive access to memory to determine which cells in the memory should be next addressed for testing. However, examination of the address sequence of the various protocols reveals that the sequences obey fixed arithmetic progressions, which, although differing among the various test protocols obey fixed rules within any one protocol. This commends the use of combinations of logic elements which can be preconditioned to generate the required address sequences with a minimum of inputs and controls from the controlling computer's memory.

OBJECTS OF THE INVENTION

With the foregoing desiderata as a goal, it is therefore an object of this invention to provide combinations of digital logic circuit elements which may be preconditioned by the entry of predetermined data thereinto and operable responsive to patterns of timing pulses to generate a desired sequence of numerical values for controlling the addressing of a memory under test.

Yet another object is to provide an address generating apparatus having a plurality of identical combinations of logic instrumentalities which are operative in combination to selectively produce address sequences for the whole or any selected area of a matrix.

These and other objects, features and advantages of the invention will be apparent from the following more particular description of the preferred embodiment of the invention as illustrated in the accompanying drawings.

THEORY OF OPERATION

Figure 2:
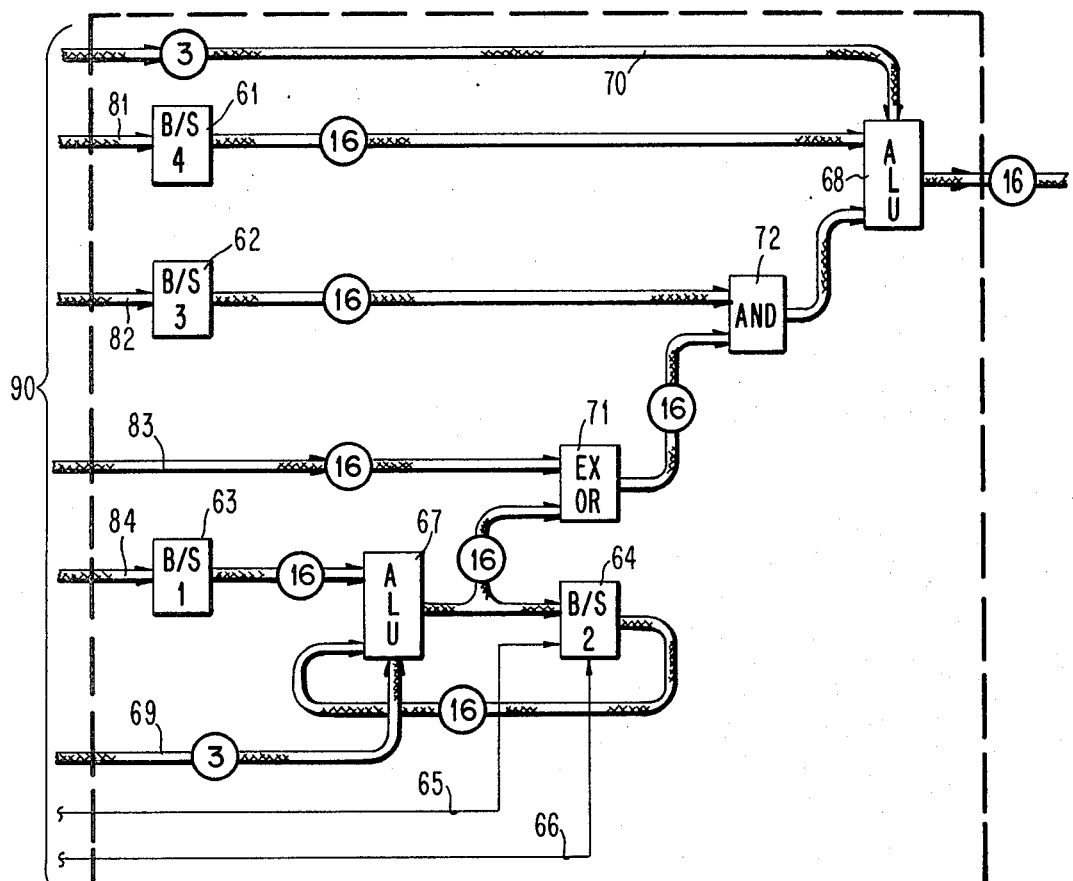
FIG. 2 is a schematic of the combination of logic elements necessary to produce a desired sequence for one coordinate address of a matrix.

Before describing the preferred embodiment it is expedient to digress and define some terms, and examine the arithmetic rules that govern the production of the desired sequences of addresses.

The memories for which this apparatus is particularly adapted to address for test purposes are two dimensional matrix memories. Thus, each cell or memory position can be defined by the coordinates of its position in the matrix. The memory matrix size is usually $2^n \times 2^m$ where n and m are integers. With these dimensions the X and Y addresses may conveniently be encoded by means of $2^n-1$ and $2^m-1$ binary bits. The addresses of the cells in a row of the matrix run from 0 to $2^n-1$, and the column cells from 0 to $2^m-1$. Thus memories commonly called 2K, 4K, 16K, etc. actually contain $2^{11}$, $2^{12}$, and $2^{14}$ cells, respectively. These may be organized in a square or rectangular matrix so long as the both dimensions are an integral power of two.

The geometry of the memory and the restriction on the dimensions of the matrix to integral powers of two make it convenient to employ combinations of simple binary logic elements to develop any desired sequence of memory addresses.

These addresses may be incremented or decremented by any desired fixed amount. They may be masked to prevent an address from exceeding a predetermined value, and if desired, repeating the sequence of values up to the value of the mask. Addresses may be offset by the addition of a constant to the sequence of base addresses so as to direct the testing to an area of the memory displaced from the origin by the value of the constant. Also the testing may be so controlled to alternate between cells obeying one sequence and cells obeying a second sequence.

DECREMENTING

To decrement a sequence of ascending binary values one need only to logically EXCLUSIVE OR each binary bit in the ascending binary value series with all binary 1's. This will cause the derived series of binary numbers to decrease in value. For example, the ascending numerical series 000(0); 001(1); 010(2) ... 111(7) will yield the descending series 111(7); 110(6); 101(5); ... 000(0). If this were extrapolated to the full capacity (16 bits) the decremented addresses would be decremented starting with the maximum value of the sixteen bits. However, because of the binary nature of the values, those derived binary values in the descending sequence which exceed the maximum address of the memory under test can be rendered ineffective by masking.

MASKING

Masking involves combining each binary bit in the desired address in a logical AND function with the binary bits representing that binary address beyond which further addressing is blocked. For example if it is desired to limit addresses to no greater than 111(7) the addresses from 000 through 111 would be reproduced without change. However, when the next count of 1000 is ANDED bit-by-bit with 0111, the derived address will be 000 and the sequence 000 through 111 will be repeated for all binary values greater than 1000.

HOME AND AWAY ADDRESSES

A further relationship which is exploited is the so-called "home" and "away" address. This permits a testing sequence wherein one memory cell (the "home" cell) may be repeatedly interrogated alternating with a succession of "away" cells. The "home" cell is then advanced to a new cell and alternately tested with a new succession of "away" cells. The succession of both the "home" and "away" cells may be either an ascending or descending series which may be incremented by any integral amount. If the "home" cell lies in the middle of an array, the succession of "away" cells will on occasion include cell addresses greater than the memory capacity. Through masking the "away" cell addresses will increase to the maximum return to zero and then approach the "home" cell by means of an increasing succession of lesser addresses. For example, if there were a linear array of 64 cells and the "home" cell had an address of 31, the succession of "away" cells would run from 32 to 63 followed by 0 through 30, the masking at 64 preventing access to a nonexistent cell and returning the series to 0.

OFFSET

A final relationship is the "offset" feature. This allows the same relative succession of cells to be tested in any desired area of the memory by adding a constant to the X and Y addresses, the constant being the X and Y displacement of the area under test relative to the origin (X=0, Y=0) of the memory matrix. The "offset" feature also permits the alternating testing of a succession of cells occupying the same relative geometric position in two different areas of a memory. This is usually reserved for exercising sense amplifiers which are shared by a plurality of memory cells.

DESCRIPTION OF THE PREFERRED EMBODIMENT

The specific test protocol chosen for any given memory is dictated by the potential fault sought to be detected and the size and geometry, including the disposition of sense amplifiers, of the memory. The address generator now to be described is preset with the necessary parameters of a constant for changing the address, whether the constant is to be effective additively or subtractively (increment/decrement), the starting point for the numerical series (base address), and the selection of the area to be tested. This is effected individually for each of the X and Y addresses. The relative times at which the addresses are changed are controlled by external cycle counters which are also preset for the desired test.

Figure 1:
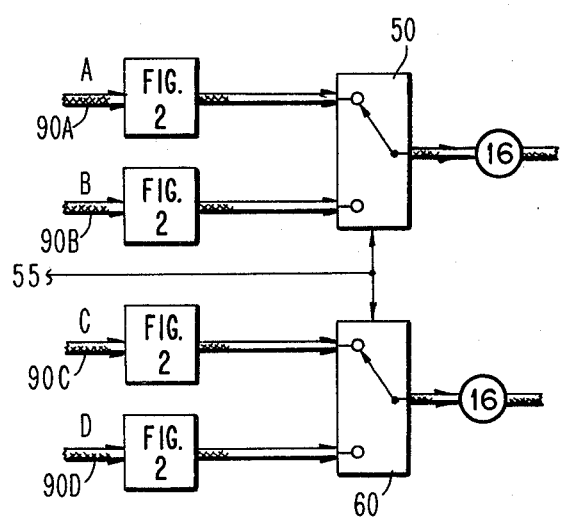
FIG. 1 is a schematic of the interconnection of the combination of elements shown in FIG. 2.

In FIG. 1 four identical address generators A, B, C and D are shown schematically, each of which is constructed in accordance with the component arrangement of FIG. 2. Inputs to the A, B, C and D units are multi-wire cables 90A, 90B 90C and 90D the individual wires, or multi-bit cables, of which are identified in detail in FIG. 2.

All of the logic units employed in FIG. 2 are standard commercially available items, which in the preferred embodiment were obtained from Texas Instruments Incorporated, whose catalogs and technical bulletins may be referred to for detailed descriptions. Each unit will be identified as TI plus its type number. Equivalent functional units from other sources may of course be substituted.

The A and B units are used to generate the X addresses, and the C and D units are used to generate the Y addresses. The A and C units produce the "home" addresses and the B and D units produce the "away" addresses. Selection of the "home" or "away" addresses is controlled by the selection units 50 (for X) and 60 (for Y) under control of an appropriately timed potential on line 55. Each of the selection units, 50 or 60, is the solid state equivalent of a 16 pole double-throw relay which has the capability of selecting 16 bits of a "home" or "away" address in the X and Y directions.

With this capability it will be intuitively appreciated that given the appropriate preset data and timing pulses any cell in a memory can be accessed in a desired sequence.

In FIG. 2 the units 61, 62, 63 and 64 consist of four four-bit buffer storage units which when strobed with an appropriate timing pulse are receptive to receive and store a total of 16 bits of binary data and to produce a corresponding composite 16 bit output. Typical of these is TI type Ser. No. 74S175. Units 67 and 68 contain four arithmetic logic units (ALU's) like TI type Ser. No. 74S381 cascaded to provide a 16 bit capacity with carry propagation. These ALU's may be conditioned for any one of eight logic functions by combinations of control potentials on three input lines (e.g. lines 69 and 70). In the application of this invention only the add function is employed.

The unit 71 is an EXCLUSIVE OR logic unit composed of four four-bit units such as TI type 74S86. The individual bit orders are individually combined so that non-alike inputs to the order will yield a "1" output on that order and like inputs will yield a "0" output. Except for the logic performed (AND) the gate 72 is similarly structured to provide sixteen outputs as the logical AND function of sixteen pairs of inputs. It is typically constructed of four TI type Ser. No. 74S08. The selectors 50 and 51 are fabricated from 4 each of TI type Ser. No. 74S157.

In FIG. 1 the cables 90A through 90D consist of the cables 69, 70, 81, 82, 83, 84 and wires 65 and 66 grouped under the bracketed designation 90 in FIG. 2. The encircled number in the individual cables signifies the number of wires within the respective cables. The capacity of the address generator in the preferred embodiment is 16X and 16Y address bits, which if fully utilized could address a memory of $2^{16} \times 2^{16}$ bits, if square. Through masking, any memory of smaller capacity or nonsquare matrix array can be addressed. For example, a 64K (65,536) by 1 bit memory (improbable) would utilize the total X capacity but only one Y address.

In the descriptions to follow it should be recalled that addresses run from 0 to $2^{n-1}$ where n is an integer.

So as not to be confused by large numbers, a simple memory of 8 by 16 will be used in the following examples. The principles can be extrapolated by expanding the memory size by powers of two.

The buffer stores 63 and 64 and the arithmetic logic unit 67 generate the sequence of base addresses independent of memory size. In essence it is a counter which counts in increments of an integral number, set as a constant into the buffer store 63, whenever a clock timing pulse is entered to strobe the buffer store to receive an input. If, for example, buffer store 63 is preset to a binary value of 1, the ALU 67 will immediately manifest a binary 1 in the low order and all zeros in the fifteen higher orders. The buffer store is initially set to all ones, which when added to the single one in ALU 67 produces a sum of all zeroes. When the output from the ALU has been utilized, a clock pulse on line 65 strobes the buffer store 64 to receive the all zeros from the ALU 67, which then adds the constant "1" from buffer store 63 to the "0" in buffer store 64 to produce a base address of 1. By activating buffer store 64 the value of the number in the ALU 67 may be increased by the constant amount stored in buffer store 63. The incrementing occurs only when the clock pulse on line 65 allows the output from the ALU 67 to be entered in the buffer store 64. This combination of the ALU 67 and buffer store 64 is the equivalent of a counter which can be preset to count by any desired increment.

As stated there are four duplicate FIG. 2 units interconnected as shown in FIG. 1. The timing pulses applied to the 65A, 65B, 65C or 65D wire in cables 90A, 90B, 90C or 90D will differ in their frequency of occurrence as a function of the relative rates at which the X-home, X-away, Y-home and Y-away addresses are to be altered.

The 16-bit output from ALU 67 is applied as one input to a 16-position EXCLUSIVE OR gate 71 which receives a second 16-bit input on cable 83 to cause the output of gate 71 to be incremented or decremented as explained above in the section entitled "Decrementing".

The incremented or decremented binary values are combined bit by bit (16 bits) with the masking bits from buffer store 62 and preset by entry on cable 82 into each of the A, B, C and D units. The manner of masking has been explained above under that section heading.

Finally, the output of AND 72 is added to the offset value stored in buffer store 61 which is preset to the desired value. The ALU 68 performs this addition under control of combinations of potentials on cable 70. The specific combination for adding for the chosen ALU's is 011. The 16-bit output from ALU 68 is the X (home/away) or Y (home/away) address employed to access the memory.

EXAMPLES OF USAGE

Galloping Pattern

In this test each successive cell becomes a "home" cell. This "away" cells are a succession of cells starting with the first cell in the array and ending with the last cell in the array. The "home" and "away" cells are tested in alternate succession and the operative "home" cell is actually tested twice, once as a "home" cell and again as an "away" cell. This simplifies the circuitry and controls and provides the same testing integrity as the more complicated "home" and "away" sequences described in the foregoing referenced publication.

The number of "away" cells is a constant and equal to the number of cells in the array. In the simple illustrative 8×16 memory (128 cells) the first home address is that of the first cell (X=0, Y=0). The succession of "away" cells is 0 through 127, which in this instance actually tests cell 0 twice.

The "home" and "away" ALU's 67A, 67B, 67C and 67D are initially preset to begin addressing at the 0-0 origin. The cables 83A through 83D potentialized with all 0's to effect incrementing. Cables 69A through 69D and 70A through 70D potentialized to control the ALU's to add. Mask registers 62A and 62C are set to a value of 0111 (the maximum X address, and the registers 62B and 62D are set to 01111 (the maximum Y address).

External counters, counting the X home and away cycles are preset to 0111. The counter for Y home and away are preset to 01111. Every interrogation cycle the Y-away counter is decremented by one count. When it recycles from 0 to its preset value of 15 it decrements the X-away counter by one count. This advances the interrogation downward in a column to the bottom, steps to the next, and proceeds in each successive column until the bottom of the last column when both the X and Y away counters will have been decremented to a zero value. This conicidence causes the Y-home counter to be decremented by one count.

The X and Y away counters recycle to 0 to begin tracking the next interrogation cycle for a new "home" cell. Each time an X and Y "home" or "away" counter is decremented, the corresponding ALU 67 is incremented. The Y-home counter, when it completes its cycle from 15 to 0, decrements the X home counter in the same manner as the Y-away counter stepped the X-away counter.

Even though the X "home" and "away" ALU's and Y "home" and "away" ALU's will have been stepped many times and manifest respective values in excess of an available address, the preset values in the mask registers will prevent the output address from exceeding the value of an available address. The counters merely provide the frequency division to effect the column stepping and cycle point counting.

Actually, in the chosen example, each one of the 128 cells becomes a "home" cell. Each "home" cell has a corresponding 128 "away" cells for a total 16,384 steps, but only 1024 repeat cycles of 16 counts each. Correspondingly the X away counter will have been decremented 1024 times, or experienced 128 repeat cycles.

Thus, while the Y-away ALU 67D will have a maximum count of 16,384 ($2^{14}$) the output from the ALU 68D will never exceed 15 (01111).

As the Y-away counter progressively steps the X-away counter and both collaborate (at 0-0) to step the Y-home counter and it in turn steps the X-home counter, the end of test will be signalled when both the Y-home and X-home counters decrement to 0. At this point the maximum address of X=7, Y=15 will have been achieved.

Diagonal Pattern

Another example of memory address sequencing is the diagonal mode. All diagonals are 45° diagonals and the number of cells in any one diagonal sequence is the same for any one memory. The cells in a diagonal may be aligned, as in the major diagonal of a square, or they may be disposed in two parallel diagonal lines. Again, using the 8×16 memory for illustrative purposes, the number of diagonals will be equal to the greater of the two dimensions (16) and the number of cells in each respective diagonal will be equal to the lesser of the two dimensions (8). There will be nine continuous diagonals and seven discontinuous diagonals wherein the sum of the cells in the two discontinuous diagonals will be eight.

Initially the X and Y address generators are set with zero offset and an increment constant of one. The mask for the X addresses will be set to a binary value of seven and the Y mask will be set to a binary value of fifteen. Both address generators will be concurrently incremented by one count. This will provide successive addresses of cells along the 45° diagonal. By virtue of the masking of the X address, the X addresses will repeat the series 0-7 sixteen times even though the base address produced by the ALU 67A and buffer store 64A will advance from 0 through 127, the masking inhibiting usage of any address in excess of seven.

The Y-address generator will cycle concurrently with the X generator from zero upward by means of clock pulses applied to line 65C. However, to prevent a recycling of the Y addresses along the same diagonal it is necessary to add an additional count to the Y address after every sixteen counts so as to precess the diagonal one matrix position. This necessity is illustrated by the following tabular succession of matrix positions.

| ADDRESS SEQUENCE ||||||||
|---|---|---|---|---|---|---|---|
| X | Y | X | Y | X | Y | X | Y |
| 0 | 0 | 0 | 2 | 0 | 4 | 0 | 6 |
| ↓ | ↓ | ↓ | ↓ | ↓ | ↓ | ↓ | ↓ |
| 7 | 7 | 7 | 9 | 7 | 11 | 7 | 13 |
| 0 | 8 | 0 | 10 | 0 | 12 | 0 | 14 |
| ↓ | ↓ | ↓ | ↓ | ↓ | ↓ | ↓ | ↓ |
| 7 | 15 | 7 | 1 | 7 | 3 | 7 | 5 |
| 0 | 1 | 0 | 3 | 0 | 5 | 0 | 7 |
| ↓ | ↓ | ↓ | ↓ | ↓ | ↓ | ↓ | ↓ |
| 7 | 8 | 7 | 10 | 7 | 12 | 7 | 14 |
| 0 | 9 | 0 | 11 | 0 | 13 | 0 | 15 |
| ↓ | ↓ | ↓ | ↓ | ↓ | ↓ | ↓ | ↓ |
| 7 | 0 | 7 | 2 | 7 | 4 | 7 | 6 |

If the successive values of the X and Y cycle counters, which are respectively preset to 7 and 15 and decremented, are set forth in similar tabular form they will appear as follows:

| X | Y | X | Y | X | Y | X | Y |
|---|---|---|---|---|---|---|---|
| 7 | 15 | 7 | 15 | 7 | 15 | 7 | 15 |
| ↓ | ↓ | ↓ | ↓ | ↓ | ↓ | ↓ | ↓ |
| 0 | 8 | 0 | 8 | 0 | 8 | 0 | 8 |
| 7 | 7 | 7 | 7 | 7 | 7 | 7 | 7 |
| ↓ | ↓ | ↓ | ↓ | ↓ | ↓ | ↓ | ↓ |
| 0 | 0 | 0 | 0 | 0 | 0 | 0 | 0 |
| 7 | 15 | 7 | 15 | 7 | 15 | 7 | 15 |
| ↓ | ↓ | ↓ | ↓ | ↓ | ↓ | ↓ | ↓ |
| 0 | 8 | 0 | 8 | 0 | 8 | 0 | 8 |
| 7 | 7 | 7 | 7 | 7 | 7 | 7 | 7 |
| ↓ | ↓ | ↓ | ↓ | ↓ | ↓ | ↓ | ↓ |
| 0 | 0 | 0 | 0 | 0 | 0 | 0 | 0 |

It will be noted that both counters achieve a simultaneous count of 0 at the end of each diagonal or eight times in the chosen example. This occurrence causes an additional count to be entered in the Y-ALU to precess the diagonal by one Y position. The only remaining timing function is to detect the end of test. This can be accomplished in a variety of ways, either by counting the number of accesses, or by counting the number of diagonals. In the former a counter preset to 127 and decremented would signal the end of test when it decremented to 0. The other would be to preset a counter to 7 and decrement it each time the X and Y counters had simultaneous zeros. When this counter receives its final decrementing pulse at the last pair of zeros to recycle it to its preset value of 7, the cycle is finished.

The foregoing example may be extrapolated to larger memories by appropriate adjustment of the parameters, taking cognizance of the rules governing the number of cells in a diagonal and the number of diagonals. Also, a discrete small area of a larger memory may be tested by using the same addressing principles and sequences, and adding an offset to the X and Y addresses.

By virtue of knowing the matrix geometry, the preset data set into the address generator and the cycle counters can be adjusted to define the area of the memory to be tested and the pattern of the test.

The home and away feature need not be confined to individual cell sequences, but may also be used to test corresponding areas of a memory which share sense amplifiers. The home and away addresses would then follow the same sequence, having identical incremental values, masking and cycle counting controls but differ only in their offsets. Alternate home and away addressing would test a succession of cells occupying the same relative positions with respect to two different geometric areas of the memory.

As has been demonstrated with the foregoing examples logic elements interconnected as hereinabove described provide for a very large variety of memory address sequences without requiring a large external memory to provide the sequences. The external memory need only provide the input data to the address generator and the cycle counters. The address generator then proceeds to produce the sequence of addresses without further reference to the external memory. In addition to utilizing a smaller external memory, the "hard-wired" address generator provides faster testing by eliminating the constant need to interrogate the external memory for further instructions.

While the invention has been particularly shown and described with reference to the preferred embodiment thereof, it will be understood by those skilled in the art that various changes in form and details may be made therein without departing from the spirit and scope of the invention.

What is claimed is:

1. In a device for testing the operation of a multi-dimensional data storage memory, an apparatus for producing a selected one of a plurality of sequences of numerical values manifestive of the successive memory elements to be tested comprising;
   (a) a plurality of pairs of address generating means, each pair consisting of a first and a second address generating means, each of said first and said second address generating means being operative responsive to preset numerical values and the receipt of timing impulses to produce a sequence of numerical values manifestive of the respective addresses of the memory elements to be tested;
   (b) selecting means connected to the outputs of said first and second address generating means of each of said pairs and operative responsive to predetermined timing impulses for selecting the outputs of said first or said second address generating means;
   (1) each of said first and said second address generating means comprising;
      i. counting means operative responsive to a succession of timing impulses and a preset differential value for producing a succession of numerical values each differing from the preceding one in the succession by the preset value;
      ii. control means operative responsive to a preset control and connected to the output of said counting means for causing the output of said counting means to ascend or descend in value;
      iii. masking means connected to the output of said control means and operative responsive to a preset value to inhibit the value of the numerical sequence from exceeding a value one less than the preset value;
      iiii. and means for adding a constant value to each of the sequence of numerical values of the sequence of numbers after the sequence is inhibited by said masking means,
   whereby said first of said address generating means produces a first unique sequence of memory addresses and said second of said address generating means produces a second unique sequence of memory addresses and said selecting means selects the intermixing of the first and second sequences.

2. The apparatus of claim 1 wherein said counting means comprises
   (a) a first storage register storing the preset differential as binary bits;
   (b) a second storage register operative responsive to a timing impulse to receive and store a binary number and to produce an output of the thus-stored number;
   (c) a binary adder having its inputs connected to the outputs of said first and said second storage registers and its output connected to the input of said second storage register;
   whereby the said adder will produce a succession of binary numbers each incrementally greater than the preceding number by the preset differential in said first register in response to the timing impulses received by said second storage register.

3. The apparatus of claim 2 wherein said control means comprises a multi-bit exclusive OR gate having as one input the multi-bit output of said binary adder and a second multi-bit input of all binary zeros or all binary ones to thereby cause the output of the exclusive OR gate to produce an ascending or descending sequence of binary numbers respectively.

4. The apparatus of claim 3 wherein said masking means comprises a multi-bit binary logical AND gate having one multi-bit input from said exclusive OR gate and a second input from the output of a multi-bit storage register storing the binary value of the highest address beyond which addressing is to be inhibited, the said value being equal to $2^{n-1}$, where n is an integer.

5. The apparatus of claim 1 wherein said first address generating means of each of the respective pairs produces an X memory address and said second address generating means of each of the respective pairs produces a Y memory address, whereby alternate selection of the first X and Y address generators or second X and Y address generators produces a first and a second sequence of memory addresses.

6. In a device for testing the operation of a two-dimensional data storage memory addressable by means of an X-address and Y-address, an apparatus for producing a sequence of binary numbers manifestive of the successive addresses of the memory elements to be tested, comprising;
   (a) a first X-address generator;
   (b) a second X-address generator;
   (c) a first Y-address generator;
   (d) a second Y-address generator;
   (e) selecting means connected to said first and second X-address generators and to said first and second Y-address generators, operative responsive to a control signal for selected the outputs from said first X and Y address generators or said second X and Y address generators;
      i. each of said first and second X and Y address generators comprising the same combination of components but each operative responsive to differently timed clock signals and preset data to provide different respective sequences of first and second X and Y addresses;
      ii. each of said address generators comprising in combination;
         a multi-bit binary adder having two multi-bit inputs and a single multi-bit output which is the sum of the two inputs;
         a multi-bit binary storage register storing a constant and connected as one input to said adder;
         a further multi-bit storage register connected to the output of said adder and operative responsive to a timing pulse to store the output of said adder, the output of said further register being connected as an input to said adder, whereby the contents of said adder are incremented by an amount equal to the stored constant upon the occurrence of each timing pulse;
         a multi-bit exclusive OR gate having as a first input the output of said adder and as a second input all binary zeros or all binary ones, whereby the output of said adder is passed by said exclusive OR gate as an ascending sequence of binary numbers or converted to a descending sequence of binary numbers respectively;
         a multi-bit logical AND gate having as one input the multi-bit output of said exclusive OR gate and a second input from a multi-bit storage register storing the binary value of the highest address beyond which addressing is to be inhibited, the said value being equal to $2^{n-1}$, where n is an integer;

a second adder having as one input the preset contents of a multi-bit storage register storing the binary displacement of the origin of the memory area to be listed from the reference origin of the addresses of the whole matrix memory;

whereby, each of the first and second X and Y address generators produces its own unique discrete sequence of addresses as a function of the timing pulses applied thereto and the variables preset thereinto, and the addresses selected from testing the memory are controlled by the control signals applied to said selecting means.

7. Circuitry for producing a selected one of a plurality of repetitive sequences of binary numbers useful for providing one of the coordinate addresses for testing a matrix memory comprising;

(a) a first multi-bit storage register storing a first constant in binary form;

(b) a second multi-bit storage register, operative responsive to a clock pulse to receive and store binary data;

(c) a first adder having one input connected to the output of said first register and the other input connected to the output of said second register and the output connected to the input of said second register;

(d) a multi-bit exclusive OR gate having as one input thereto a control consisting of all binary zeros or all binary ones and a second input from the output of said adder;

(e) a third multi-bit storage register storing the binary value of the highest address beyond which addressing is to be inhibited, the said value being equal to $2^{n-1}$, where n is an integer;

(f) a multi-bit logical AND gate having one input connected to the output of said exclusive OR gate and a second input connected to the output of said register;

(g) a fourth multi-bit storage register storing a second constant in binary form; and (h) a second multi-bit adder having one input connected to the output of said logical AND gate and the second input connected to the ouptut of said fourth storage register;

whereby a sequence of ascending binary numbers, each greater than the preceding one by the value of said first stored constant, will be produced at the output of said first adder in response to a succession of clock pulses received by said second register, which sequence will be passed unaltered by said exclusive OR gate if it has all zeros as an input or be converted to a descending sequence if it receives all ones, the resulting ascending or descending sequence will be inhibited from exceeding a binary value of one less than the selected number stored in said third register and caused to repeat the sequence upon attaining the inhibiting value, and the thus-limited sequence will be displaced in value as a function by the constant stored in said fourth register.

* * * * *